(12) United States Patent
Hyun et al.

(10) Patent No.: US 12,051,375 B2
(45) Date of Patent: Jul. 30, 2024

(54) DISPLAY DEVICE

(71) Applicant: SAMSUNG DISPLAY CO., LTD., Yongin-si (KR)

(72) Inventors: Chang Ho Hyun, Yongin-si (KR); Chang Woo Kahng, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/151,338

(22) Filed: Jan. 6, 2023

(65) Prior Publication Data

US 2023/0178030 A1    Jun. 8, 2023

Related U.S. Application Data

(62) Division of application No. 16/775,698, filed on Jan. 29, 2020, now Pat. No. 11,574,600.

(30) Foreign Application Priority Data

Jun. 17, 2019   (KR) .................. 10-2019-0071673

(51) Int. Cl.
*G09G 3/20* (2006.01)
*G09G 3/3208* (2016.01)
*G09G 3/3275* (2016.01)

(52) U.S. Cl.
CPC ......... *G09G 3/3275* (2013.01); *G09G 3/2007* (2013.01); *G09G 3/3208* (2013.01); *G09G 2310/027* (2013.01)

(58) Field of Classification Search
None
See application file for complete search history.

(56) References Cited

U.S. PATENT DOCUMENTS

| | | |
|---|---|---|
| 10,140,909 B2 | 11/2018 | Wang |
| 10,580,848 B1 | 3/2020 | Ma et al. |
| 10,795,417 B2 | 10/2020 | Bok et al. |
| 10,845,630 B2 | 11/2020 | Li |

(Continued)

FOREIGN PATENT DOCUMENTS

| | | |
|---|---|---|
| CN | 102645779 A | 8/2012 |
| CN | 106205398 A | 12/2016 |

(Continued)

OTHER PUBLICATIONS

Extended European Search Report for European Patent Application No. 20174302.8 dated Oct. 16, 2020.

(Continued)

*Primary Examiner* — Parul H Gupta
(74) *Attorney, Agent, or Firm* — CANTOR COLBURN LLP

(57) ABSTRACT

A display device includes a substrate, a display panel including a first display area, a second display area, and a third display area between the first and second display areas, each of the first, second, and third display areas including a plurality of pixels, and a sensor which is between the substrate and the first display area of the display panel and senses an external object through the first display area. A first pixel density of the first display area is less than a second pixel density of the second display area, and a pixel density of the third display area varies with relative distances from the first display area.

4 Claims, 11 Drawing Sheets

(56) References Cited

U.S. PATENT DOCUMENTS

| | | | |
|---|---|---|---|
| 10,950,170 B2 | 3/2021 | Li | |
| 11,424,234 B2 | 8/2022 | Ding et al. | |
| 2006/0124833 A1* | 6/2006 | Toda | H01L 27/14685 |
| | | | 250/214 R |
| 2011/0254759 A1* | 10/2011 | Mori | G09G 3/3614 |
| | | | 345/88 |
| 2012/0113379 A1* | 5/2012 | Tomizawa | G09G 3/3607 |
| | | | 349/187 |
| 2013/0278488 A1 | 10/2013 | Huo | |
| 2014/0218971 A1 | 8/2014 | Wu | |
| 2016/0189619 A1* | 6/2016 | Park | G09G 3/3233 |
| | | | 345/77 |
| 2019/0130822 A1* | 5/2019 | Jung | G09G 3/2003 |
| 2019/0196635 A1 | 6/2019 | Park et al. | |
| 2019/0326366 A1* | 10/2019 | Fan | H10K 59/35 |
| 2020/0066809 A1 | 2/2020 | Liu | |
| 2020/0075680 A1* | 3/2020 | Sun | H10K 59/38 |
| 2021/0013277 A1 | 1/2021 | Liu et al. | |
| 2021/0065625 A1 | 3/2021 | Wang et al. | |
| 2021/0358379 A1* | 11/2021 | Li | H10K 59/121 |
| 2022/0102687 A1* | 3/2022 | Wang | G02B 5/3016 |
| 2022/0148522 A1* | 5/2022 | Jang | G09G 3/3233 |

FOREIGN PATENT DOCUMENTS

| | | |
|---|---|---|
| CN | 108269840 A | 7/2018 |
| CN | 108766347 A | 11/2018 |
| CN | 109001934 A | 12/2018 |
| CN | 109037298 A | 12/2018 |
| CN | 109192759 A | 1/2019 |
| CN | 208507679 U | 2/2019 |
| CN | 109599053 A | 4/2019 |
| EP | 3428967 A1 | 1/2019 |
| JP | 2017058671 A | 3/2017 |
| KR | 1020170113066 A | 10/2017 |
| KR | 1020180050473 A | 5/2018 |
| KR | 1020180057796 A | 5/2018 |
| WO | 2019062221 A1 | 4/2019 |
| WO | 2019062236 A1 | 4/2019 |

OTHER PUBLICATIONS

Chinese Office Action mailed Mar. 25, 2024 in Chinese Application No. 202010428907.3, 11 pages.

* cited by examiner

DISPLAY DEVICE

The application is a divisional of U.S. patent application Ser. No. 16/775,698, filed on Jan. 29, 2020, which claims priority to Korean patent application number 10-2019-0071673 filed on Jun. 17, 2019, and all the benefits accruing therefrom under 35 U.S.C. § 119, the content of which in its entirety is herein incorporated by reference.

BACKGROUND

1. Field

Various exemplary embodiments of the invention relate to a display device, and more particularly, to a display device including a display panel and a sensor.

2. Related Art

A display device displays an image using pixels (or pixel circuits). The display device includes a sensor, a camera, etc., in a bezel (or an edge portion) performing through a front surface (e.g., one surface on which an image is displayed) of the display device. The display device may recognize an object using a photosensor, and may acquire a picture and a video using a camera, for example.

As the bezel of the display device becomes narrower, a gaze of a user may be fixed or focused on an image (or a screen of the display device). Recently, a research into and a development of full-screen display technology in which the bezel (i.e., the non-display area) on the front surface of the display device is minimized or eliminated and an infrared sensor arranged in the bezel is rearranged and in which an image is displayed on the entire front surface of the display device have been conducted.

SUMMARY

Various exemplary embodiments of the invention are directed to a display device including a pixel array structure in which the pixel density of a second display area decreases in a direction farther away from a first display area.

Various exemplary embodiments of the invention are directed to a display device having a pixel array structure in which the number of black pixels in a second display area decreases in a direction farther away from a first display area.

However, objects of the invention are not limited to the foregoing objects, and may be expanded in various forms without departing from the spirit and scope of the invention.

An exemplary embodiment of the invention may provide for a display device. The display device may include a substrate, a display panel including a first display area, a second display area, and a third display area interposed between the first and second display areas, the first, second, and third display areas including a plurality of pixels, and a sensor which is interposed between the substrate and the first display area of the display panel and senses an external object through the first display area. A first pixel density of the first display area may be less than a second pixel density of the second display area, and a pixel density of the third display area may vary with relative distances from the first display area.

In an exemplary embodiment, the pixel density of the third display area may increase in a direction farther away from the first display area.

In an exemplary embodiment, the pixel density of the third display area may be greater than the first pixel density and is less than the second pixel density.

In an exemplary embodiment, the first display area may further include pixel rows, each including pixel areas in which pixels of the plurality of pixels are arranged and transmissive areas in which the plurality of pixels is not arranged, and the transmissive areas are disposed at intervals of a preset first distance in each of the pixel rows.

In an exemplary embodiment, the third display area may further include first to k-th sub-areas, each including the pixel areas and the transmissive areas, where k is a natural number greater than 1.

In an exemplary embodiment, the transmissive areas in a pixel row included in the first sub-area may be disposed at intervals of a second distance greater than the first distance, and the transmissive areas in a pixel row included in the k-th sub-area are disposed at intervals of a third distance greater than the second distance.

In an exemplary embodiment, the first sub-area may be adjacent to the first display area, and the k-th sub-area is adjacent to the second display area, and a distance between the transmissive areas in a first direction may increase in a direction from the first sub-area to the k-th sub-area.

In an exemplary embodiment, a number of pixels of the plurality of pixels included in each of the first to k-th sub-areas may increase in a direction from the first sub-area to the k-th sub-area.

In an exemplary embodiment, lengths of the first display area, the second display area, and the third display area in the first direction may be substantially equal to each other.

In an exemplary embodiment, for an identical image, a luminance of the first sub-area may be lower than a luminance of the k-th sub-area.

In an exemplary embodiment, in each transmissive area, a light-emitting element and a transistor may be not disposed.

In an exemplary embodiment, the third display area may surround the first display area.

In an exemplary embodiment, the third display area may further include a first sub-area including pixels of the plurality of pixels that surround the first display area, and a second sub-area including pixels of the plurality of pixels that surround the first sub-area.

In an exemplary embodiment, each of the first display area, the first sub-area, and the second sub-area may further include pixel areas in which pixels of the first display area and the pixels of the first and second sub-areas are arranged and transmissive areas in which the plurality of pixels is not arranged.

In an exemplary embodiment, a first ratio indicating a ratio of the transmissive areas to the pixel areas in the first display area may be greater than a second ratio indicating a ratio of the transmissive areas to the pixel areas in the first sub-area, and the second ratio may be greater than a third ratio indicating a ratio of the transmissive areas to the pixel areas in the second sub-area.

In an exemplary embodiment, the transmissive areas of the first sub-area are provided along a boundary of the first display area, and the transmissive areas of the second sub-area may be provided along a boundary of the first sub-area, and a distance between the transmissive areas of the first sub-area may be less than a distance between the transmissive areas of the second sub-area.

An exemplary embodiment of the invention may provide for a display device. The display device may include a substrate, a display panel including a first display area, a second display area, and a third display area interposed between the first and second display areas, the first, second, and third display areas including a plurality of pixels, and a sensor which is interposed between the substrate and the first display area of the display panel and senses an external object through the first display area. The first display area may include pixel areas in which pixels of the plurality of pixels are arranged and transmissive areas in which the plurality of pixels is not arranged, the second display area and the third display area may not include the transmissive areas, the third display area may include valid pixels of the plurality of pixels which display an image and black pixels the plurality of pixels which display a black grayscale or do not emit light, and a number of the black pixels may decrease in a direction farther away from the first display area.

In an exemplary embodiment, in each transmissive area, a light-emitting element and a pixel circuit may be not disposed, and each black pixel may include the light-emitting element and the pixel circuit.

In an exemplary embodiment, the third display area may further include a first sub-area which surrounds at least a portion of the first display area, and a second sub-area disposed outside the first sub-area, and a ratio of the black pixels to the valid pixels included in the first sub-area may be greater than a ratio of the black pixels to the valid pixels included in the second sub-area.

In an exemplary embodiment, the display device may further include a data driver which supplies data signals to the plurality of pixels, wherein the data driver may supply only a black data signal corresponding to the black grayscale to the black pixels.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
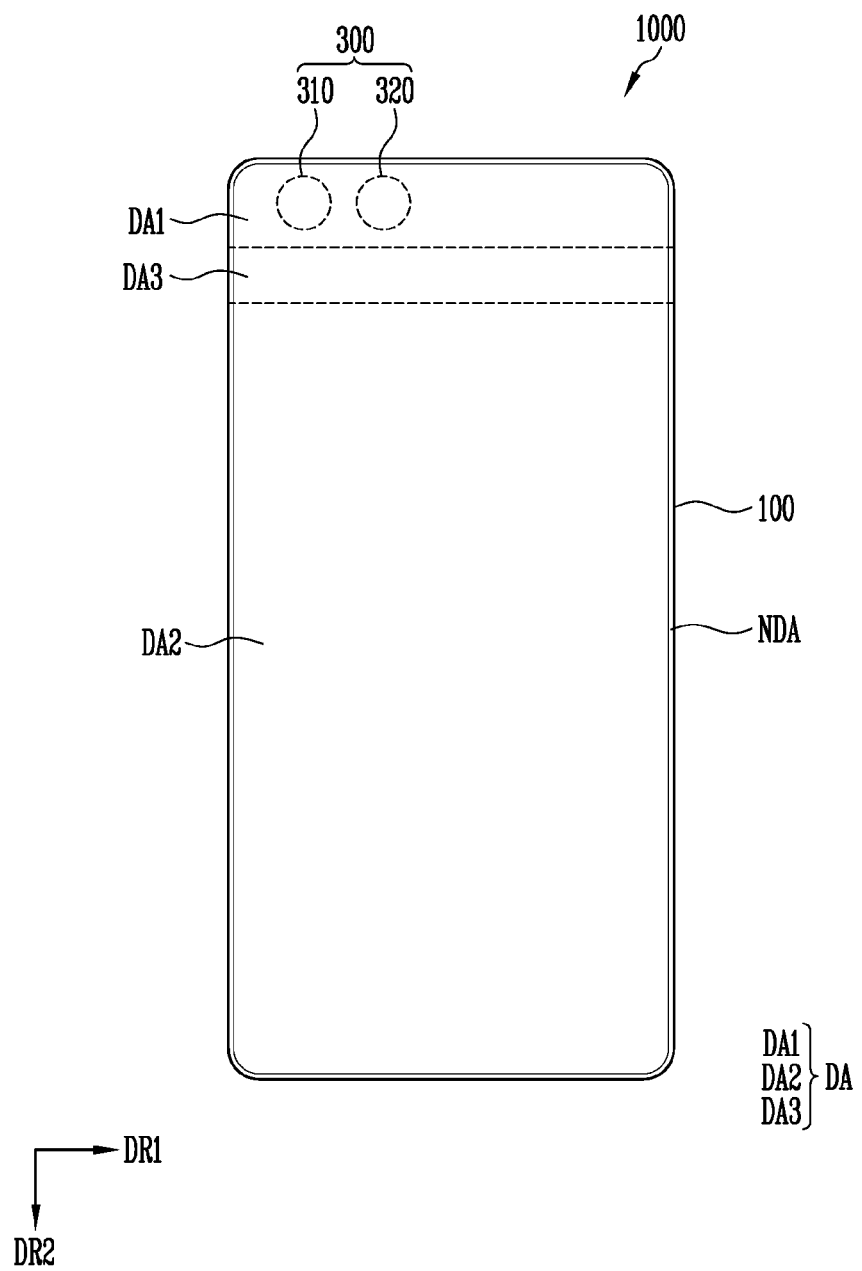
FIG. 1 is a diagram illustrating an exemplary embodiment of a display device according to the invention.

Exemplary embodiments of the invention will hereinafter be described in detail with reference to the accompanying drawings. The same reference numerals are used to designate the same or similar components throughout the drawings, and repeated descriptions of the same components will be omitted.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
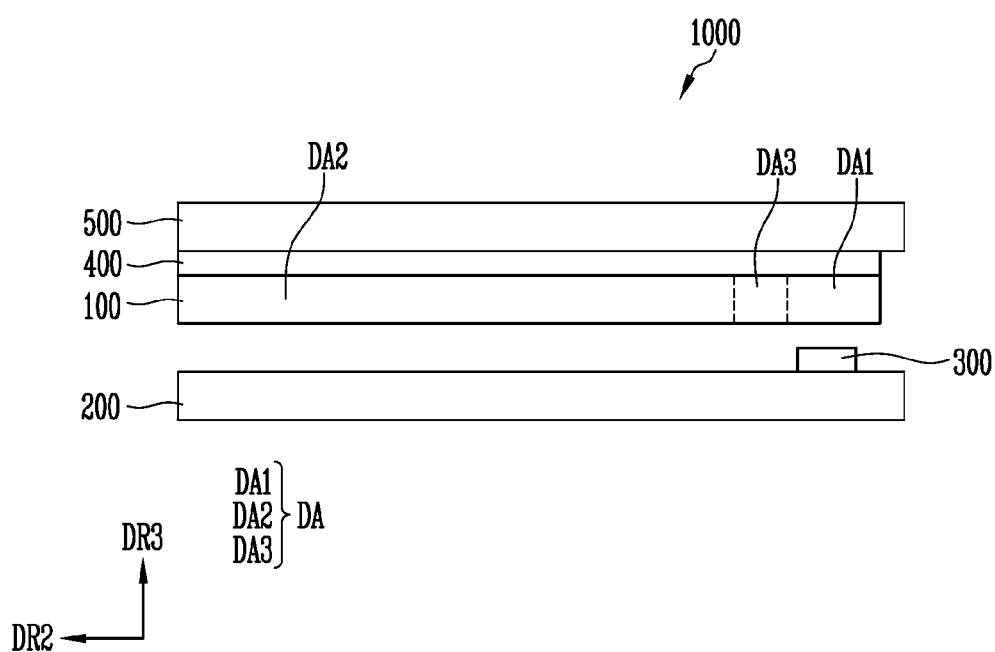
FIG. 2 is a cross-sectional view illustrating an exemplary embodiment of the display device of FIG. 1.

FIG. 1 is a diagram illustrating an exemplary embodiment of a display device according to the invention, and FIG. 2 is a cross-sectional view illustrating an exemplary embodiment of the display device of FIG. 1.

Referring to FIGS. 1 and 2, a display device 1000 may include a display panel 100, a substrate 200, and at least one sensor 300. In an exemplary embodiment, the display device 1000 may include a touch sensor layer 400 and a window layer 500.

In an exemplary embodiment, the display device 1000 may be applied to various electronic devices, such as a smartphone, a tablet, a smart pad, a television ("TV"), and a monitor.

The substrate 200 may hold the display panel 100 and the sensor 300. In an exemplary embodiment, the substrate 200 may be a bracket, a casing, or the like, and may include a plastic material or a metal material. The substrate 200 may form the appearance of a rear surface of the display device 1000, and may protect components included in an electronic device from external stress.

In an exemplary embodiment, the display panel 100 may be a flat display panel or a flexible display panel. In an exemplary embodiment, the display panel 100 may include a rigid base layer including glass or plastic, or a flexible base layer, such as a plastic film. The display panel 100 may display an image using a pixel circuit (a plurality of transistors) and a light-emitting element, such as an organic light-emitting diode ("OLED"), which are arranged on the base layer. The light-emitting element and the pixel circuit may be covered with a thin-film encapsulation layer. The thin-film encapsulation layer may suppress degradation of element characteristics by sealing the light-emitting element from an outdoor air environment including moisture and oxygen. Here, the light-emitting element is not limited to such an OLED. In an exemplary embodiment, the light-emitting element may be an inorganic light-emitting element which includes an inorganic light-emitting material, or a light-emitting element (i.e., a quantum dot display element) which emits light by changing the wavelength of emitted light using quantum dots, for example.

The display panel 100 may include a display area DA which includes a plurality of pixels, and a non-display area NDA which is disposed on at least one side of the display area DA. The entire front surface of the display panel 100 may substantially correspond to the display area DA so as to minimize the non-display area NDA (e.g., a bezel).

In FIG. 1, although the non-display area NDA is illustrated as being in a portion of the front surface of the display panel, the invention is not limited thereto. In an exemplary embodiment, the display area DA may extend to at least one side surface of the display panel 100, and then an edge display may be implemented, for example. In this case, the non-display area NDA may be present only on some of the side surfaces of the display panel 100.

The display area DA may include first to third display areas DA1, DA2, and DA3. The first display area DA1 may include a portion overlapping the sensor 300. The first display area DA1 may have a first pixel density. The second display area DA2 may occupy most of the display area DA. The second display area DA2 may have a second pixel density, and the second pixel density may be greater than the first pixel density.

Here, the pixel density may be defined as the total area (size) of a portion, in which pixels are actually arranged, to the total area (size) of the corresponding display area or as the total area of pixels included in a preset unit area. Here, the area of a portion in which each pixel is arranged may be the area of the light-emitting surface of a light-emitting element included in the corresponding pixel. In an exemplary embodiment, when the pixel includes an organic light-emitting element, the area of the pixel may be the area of an anode electrode exposed between pixel-defining layers or the area of a light-emitting layer, for example.

Accordingly, the light transmissivity of the first display area DA1 may be higher than that of the second display area DA2, and a predetermined sensing operation by the sensor 300 disposed below the first display area DA1 may be performed. However, since the first pixel density is lower than the second pixel density, the luminance of the first display area DA1 becomes lower than that of the second display area DA2, so that such a luminance difference may be perceived by the user, thus resulting in inconvenience.

The third display area DA3 may be interposed between the first display area DA1 and the second display area DA2. The pixel density of the third display area DA3 may vary with relative distances to the first display area DA1 and the second display area DA2. In an exemplary embodiment, the pixel density of the third display area DA3 may increase in a direction farther away from the first display area DA1.

Also, the pixel density of the third display area DA3 may be higher than the first pixel density and lower than the second pixel density.

Since the pixel density of the third display area DA3 gradually increases in a direction closer to the second display area DA2, a luminance difference between the first and second display areas DA1 and DA2 may gradually change in the third display area DA3. Therefore, a sudden luminance change between the first display area DA1 and the second display area DA2 may not be perceived by the user, and image quality may be improved.

In an exemplary embodiment, the widths of the first to third display areas DA1, DA2, and DA3 in a first direction DR1 may be substantially equal to each other. In an exemplary embodiment, the first direction DR1 may correspond to a pixel row direction (i.e., the scanning direction of scan lines or the arrangement direction of pixels coupled in common to a single scan line), for example. In this case, the first pixel density, the second pixel density, and the pixel density of the third display area DA3 may be calculated for each pixel row, and may be derived from the number of pixels corresponding to each pixel row.

The sensor 300 may be interposed between the substrate 200 and the display panel 100. That is, the sensor 300 may be disposed below the rear surface of the display panel 100. The sensor 300 may overlap the first display area DA1. Although the first display area DA1 is illustrated as being wider than the sensor 300 in FIG. 1, the relationship between the first display area DA1 and the sensor 300 is not limited thereto. In an exemplary embodiment, the first display area DA1 and the sensor 300 may be provided to have substantially the same area, or alternatively, the first display area DA1 may be provided to be smaller than the sensor 300, for example.

In an exemplary embodiment, the sensor 300 may be a photo-sensing (e.g., infrared sensing)-type optical sensor. In an exemplary embodiment, the sensor 300 may include a biometric information sensor 310, such as a fingerprint sensor, an iris recognition sensor, and an artery sensor. However, this is merely exemplary, and the photo-sensing-type sensor 300 may further include a gesture sensor, a motion sensor, a proximity sensor, an illuminance sensor, or an image sensor. Also, an optical device, such as the camera 320, and an electronic part, such as a speaker (receiver), may be disposed below the first display area DA1.

As the aperture ratio (transmissivity) of the first display area DA1 corresponding to the photo-sensing-type sensor 300 is higher, the sensitivity and accuracy of the sensor 300 may be increased. Therefore, pixels arranged in the first display area DA1 may be disposed at a pixel density lower than that of other display areas. In an exemplary embodiment, pixels per inch ("PPI") of the first display area DA1 may be lower than PPI of the second display area DA2, for example.

In an exemplary embodiment, the touch sensor layer 400 may be disposed on the display panel 100. The touch sensor layer 400 may be disposed in accordance with the entire surface of the display area DA of the display panel 100, or may be provided to have an area larger than the display area DA while covering the display area DA. In accordance with an exemplary embodiment, the touch sensor layer 400 may be driven in a capacitive type, a resistive film type or the like.

The touch sensor layer 400 may be disposed on the display panel 100 through an adhesive member, or may be directly disposed on the display panel 100 through a continuous process, such as patterning in a manufacturing process for the display panel 100. However, this is merely exemplary, and the touch sensor layer 400 may be disposed in the display panel 100.

The window layer 500 may be disposed on the touch sensor layer 400. The window layer 500 may be arranged in an outermost portion of the front surface (i.e., the display surface) of the display device 1000, and may protect components in the display device 1000 from an external attack, a scratch, etc. The window layer 500 may include a glass material or a polymer film. In an exemplary embodiment, the window layer 500 may include at least one of polyimide, polyethylene terephthalate ("PET"), and an additional polymer material, for example. The window layer 500 may include a transparent material.

Figure 3:
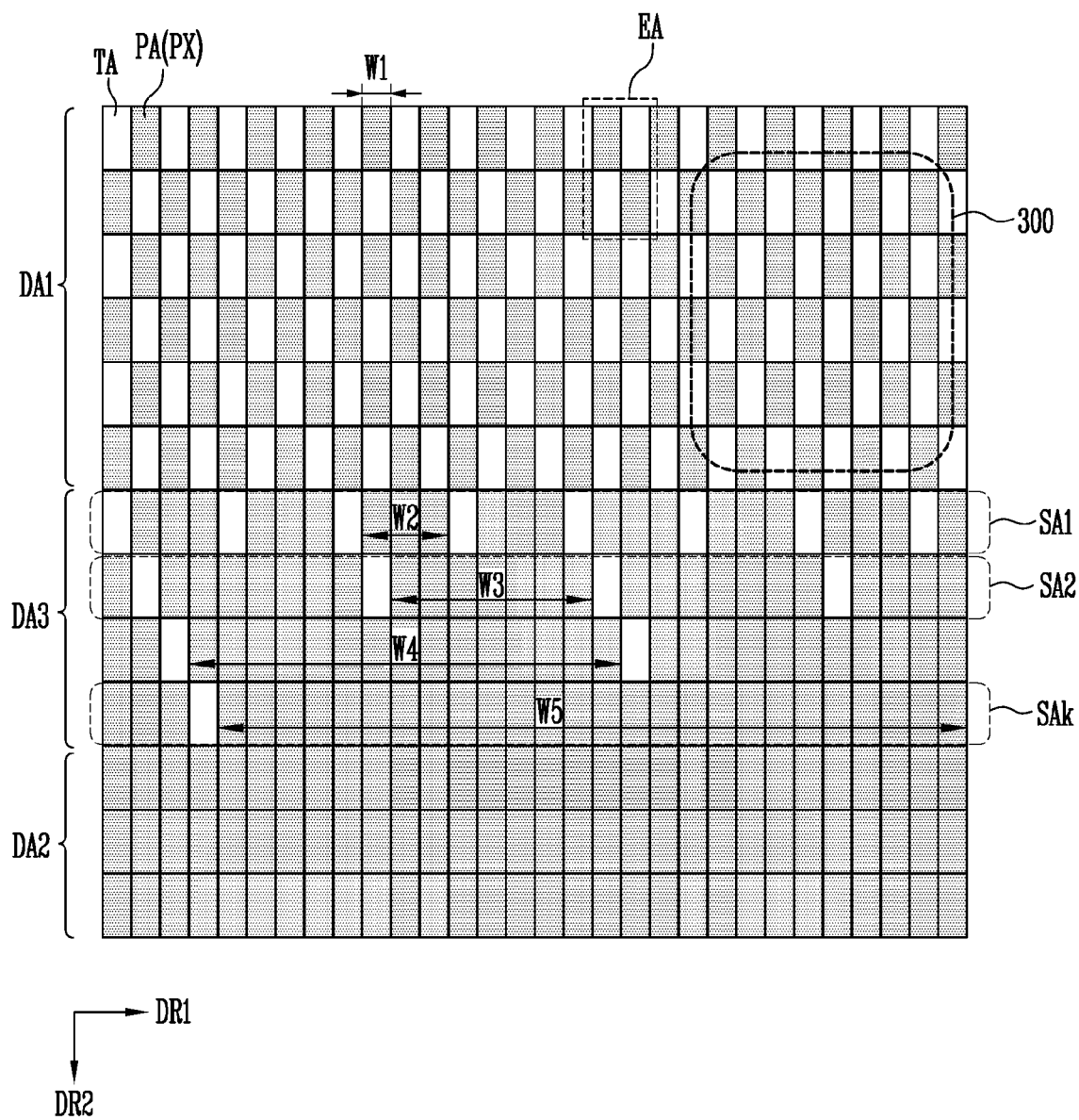
FIG. 3 is a view schematically illustrating an exemplary embodiment of a display area of the display device of FIG. 1.
Figure 4A:
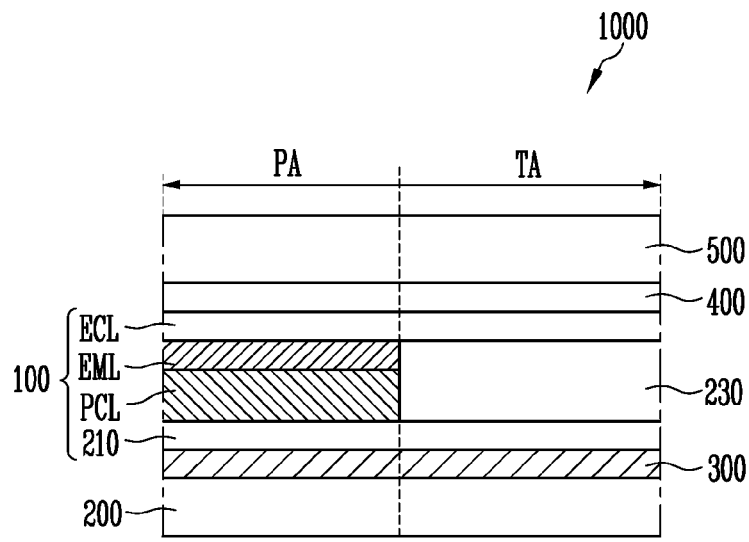
FIG. 4A is a cross-sectional view schematically illustrating an exemplary embodiment of some of pixel areas and transmissive areas included in the display area of FIG. 3.
Figure 4B:
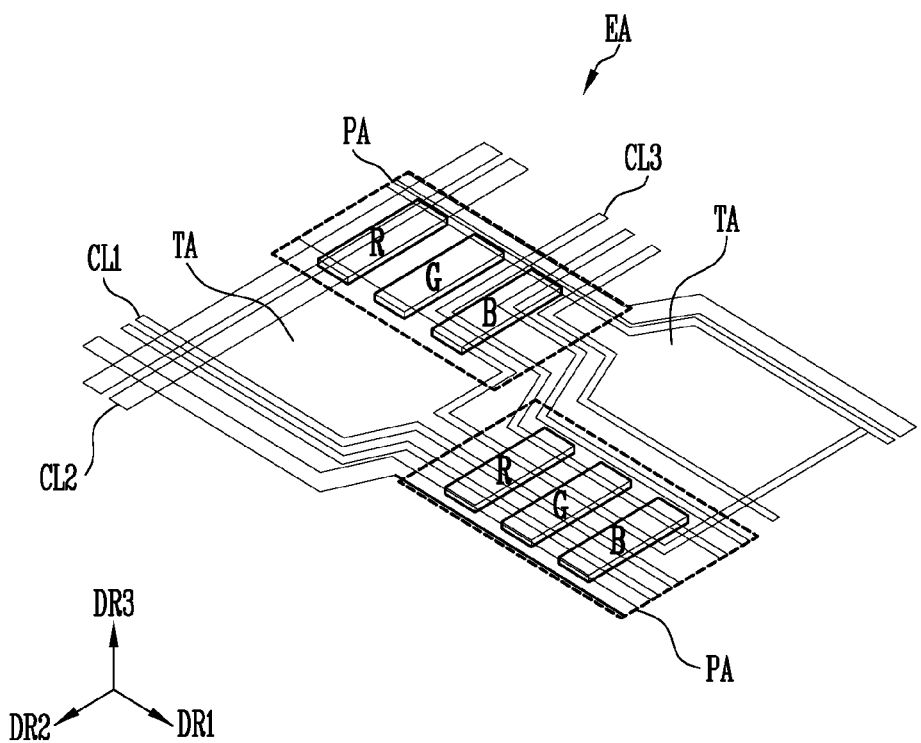
FIG. 4B is a perspective view schematically illustrating an exemplary embodiment of an area EA included in the display area of FIG. 3.

FIG. 3 is a view schematically illustrating an exemplary embodiment of the display area of the display device of FIG. 1, FIG. 4A is a cross-sectional view schematically illustrating an exemplary embodiment of some of pixel areas and transmissive areas included in the display area, and FIG. 4B is a perspective view schematically illustrating an exemplary embodiment of an area EA included in the display area of FIG. 3.

Referring to FIGS. 1, 3, and 4A and 4B, the display panel 100 may include first to third display areas DA1, DA2, and DA3.

In an exemplary embodiment, in the first to third display areas DA1, DA2, and DA3, a pixel row may be defined by pixels arranged in a first direction DR1, and a pixel column may be defined by pixels PX arranged in a second direction DR2 intersecting the first direction DR1.

The first display area DA1 may include a portion overlapping the sensor 300. In an exemplary embodiment, the first display area DA1 may include pixel areas PA in which pixels PX are arranged and transmissive areas TA in which pixels PX are not arranged.

In an exemplary embodiment, in each transmissive area TA, a light-emitting element and transistors constituting a pixel PX are not arranged. That is, the fact that a pixel PX is not arranged may be understood to indicate that a light-emitting element and transistors constituting a pixel circuit are not arranged (or disposed).

In an exemplary embodiment, the pixel areas PA and the transmissive areas TA included in the first display area DA1 may have a stacked structure provided in a third direction DR3, such as that illustrated in FIG. 4B. The sensor 300 disposed on the substrate 200, such as a casing, may overlap both a pixel area PA and a transmissive area TA.

The display panel 100 may include a base layer 210, a pixel circuit layer PCL, a light-emitting element layer EML, and an encapsulation layer ECL.

The base layer 210 may be disposed on the sensor 300. The base layer 210 may include a transparent insulating material, such as glass or transparent plastic.

The pixel circuit layer PCL may be disposed in the pixel area PA on the base layer 210. The pixel circuit layer PCL may include at least one transistor, at least one capacitor, and at least one signal line coupled to the light-emitting element. The pixel circuit layer PCL may be provided via the stacking of a semiconductor layer, a plurality of insulating layers, and a plurality of conductive layers. Also, as illustrated in FIG. 4B, a plurality of signal lines CL1, CL2, and CL3 may be coupled to the pixel circuit layer PCL. In an exemplary embodiment, the signal lines CL1, CL2, and CL3 may include a scan line for transferring a scan signal, a data line for transferring a data signal, an emission control line for transferring an emission control signal, a power line for transferring a supply voltage, etc., for example.

In an exemplary embodiment, the pixel circuit layer PCL and the signal lines CL1, CL2, and CL3 may be disposed to avoid a transmissive area TA. However, this structure is merely exemplary, and at least some of the signal lines CL1, CL2, and CL3 may be provided to pass through a transmissive area TA.

The light-emitting element layer EML may be disposed on the pixel circuit layer PCL. The light-emitting element layer EML may include a plurality of electrode layers and a light-emitting layer. The light-emitting element layer EML may also be disposed to avoid a transmissive area TA.

In an exemplary embodiment, when the light-emitting element layer EML includes an organic light-emitting element, the light-emitting element layer EML may include a first electrode layer (e.g., anode electrode), a second electrode layer (e.g., cathode electrode), and an organic light-emitting layer between the first and second electrode layers, for example. However, the second electrode layer may be implemented as a common electrode layer, and may be disposed, as a transparent electrode, while extending to the transmissive area TA.

In an exemplary embodiment, as illustrated in FIG. 4B, each pixel PX included in the pixel area PA may include a plurality of sub-pixels R, G, and B. The sub-pixels R, G, and B may emit light in different colors, respectively. In an exemplary embodiment, each of the sub-pixels R, G, and B may emit one of red light, green light, and blue light, for example. However, the invention is not limited thereto, and the sub-pixels may emit various other colors.

A transparent insulating layer 230 may be disposed in the transmissive area TA on the base layer 210. In an exemplary embodiment, the transparent insulating layer 230 may have a structure in which at least one inorganic insulating layer and at least one organic insulating layer are stacked.

As illustrated in FIG. 4B, the signal lines CL1, CL2, and CL3 may be disposed to avoid the transmissive area TA in order to improve an aperture ratio. However, since this structure is merely exemplary, at least some of the signal lines CL1, CL2, and CL3 may be disposed to pass through the transmissive area TA, and the signal lines CL1, CL2, and CL3 passing through the transmissive area TA may include a transparent conductive material.

The encapsulation layer ECL may be disposed on the light-emitting element layer EML and the transparent insulating layer 230. The encapsulation layer ECL may be provided via an alternate arrangement of at least one inorganic insulating layer and at least one organic insulating layer.

On the encapsulation layer ECL, a touch sensor layer 400 and a window layer 500 may be sequentially arranged.

In this way, each transmissive area TA may be understood to be an area in which pixels PX are removed from the display area DA, and the sensor 300 may sense various information such as biometric information, proximity information, gesture information, etc., using light having passed through the transmissive area TA.

In an exemplary embodiment, the first display area DA1 may include a plurality of pixel rows. In each of the pixel rows of the first display area DA1, the transmissive areas TA may be disposed at intervals of a first distance W1 along the first direction DR1. In an exemplary embodiment, the first distance W1 may correspond to the width of one pixel area PA, for example. Here, in the first pixel row included in the first display area DA1, pixels PX may be arranged at positions corresponding to even-numbered pixel columns, and in the second pixel row of the second display area DA2, pixels PX may be arranged at positions corresponding to odd-numbered pixel columns.

In order to minimize the deterioration of image quality while securing the transmissivity of the first display area DA1, the pixel areas PA and the transmissive areas TA may be alternately arranged in a check pattern, as illustrated in FIG. 3. That is, the pixel areas PA and the transmissive areas TA may be alternately arranged in the first direction DR1 and the second direction DR2. However, this is merely exemplary, and positions and arrangement relationships between the pixel areas PA and the transmissive areas TA in the first display area DA1 are not limited thereto.

The second display area DA2 may occupy most of the display area DA. In an exemplary embodiment, the second display area DA2 does not include transmissive areas TA.

As illustrated in FIG. 3, the first pixel density of the first display area DA1 may be about half the second pixel density of the second display area DA2. In an exemplary embodiment, the number of pixels PX included in one pixel row of the first display area DA1 may be half the number of pixels PX included in one pixel row of the second display area DA2, for example.

The third display area DA3 may be interposed between the first display area DA1 and the second display area DA2. The third display area DA3 may mitigate the perception of a luminance difference between the first display area DA1 and the second display area DA2. In an exemplary embodiment, the third display area DA3 may include transmissive areas TA at preset positions, for example.

The pixel density of the third display area DA3 may increase in a direction farther away from the first display area DA1. In an exemplary embodiment, the third display area DA3 may include first to k-th (where k is a natural number greater than 1) sub-areas SA1 to SAk. Among the first to k-th sub-areas SA1 to SAk, the first sub-area SA1 may be closest to the first display area DA1, and the k-th sub-area SAk may be closest to the second display area DA2.

In an exemplary embodiment, each of the first to k-th sub-areas SA1 to SAk may correspond to one pixel row. In a direction from the first sub-area SA1 to the k-th sub-area SAk, distances (i.e., W2, W3, W4, and W5) between the transmissive areas in the first direction DR1 may gradually increase.

In an exemplary embodiment, transmissive areas TA may be disposed at intervals of the second distance W2 in the first sub-area SA1, may be disposed at intervals of the third distance W3 in the second sub-area SA2, and may be disposed at intervals of the fifth distance W5 in the k-th sub-area SAk, for example. The third distance W3 may be greater than the second distance W2, and the fifth distance W5 may be greater than the third distance W3.

In an exemplary embodiment, three pixels PX may be consecutively arranged between the transmissive areas TA included in the first sub-area SA1, and seven pixels PX may be consecutively arranged between the transmissive areas TA included in the second sub-area SA2, for example. More than seven pixels PX may be consecutively arranged between the transmissive areas TA included in the k-th sub-area SAk.

In other words, in a direction from the first sub-area SA1 to the k-th sub-area SAk, the number of pixels PX included in each of the first to k-th sub-areas SA1 to SAk having the same area (size) may increase. In an exemplary embodiment, the ratio of transmissive areas TA to pixel areas PA in the first sub-area SA1 may be greater than the ratio of transmissive areas TA to pixel areas PA in the second sub-area SA2, for example.

Therefore, in a direction from the first sub-area SA1 to the k-th sub-area SAk, the luminance of an image may gradually increase.

The arrangement of transmissive areas TA illustrated in FIG. 3 is merely exemplary, and the positions, distances, and sizes of transmissive areas TA arranged in the third display area DA3 are not limited thereto. The third display area DA3 may include an array structure of the pixels PX and the transmissive areas TA, which may mitigate the perception of the luminance difference between the first display area DA1 and the second display area DA2.

Figure 5:
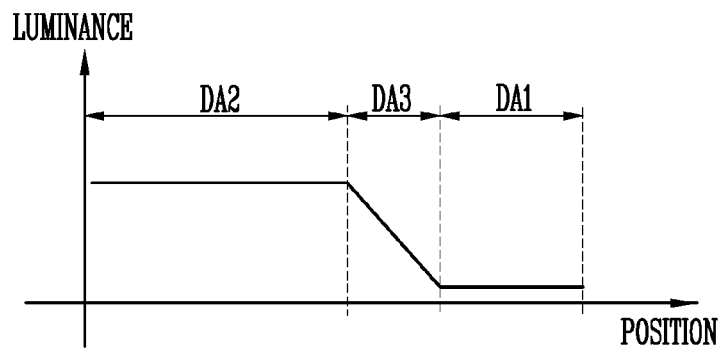
FIG. 5 is a graph illustrating an exemplary embodiment of a luminance difference depending on the display area.

FIG. 5 is a graph illustrating an exemplary embodiment of a luminance difference depending on the display area.

Referring to FIGS. 1, 3, and 5, the luminance values of the first to third display areas DA1 to DA3 may differ from each other for the same image.

In an exemplary embodiment, the first pixel density of the first display area DA1 may be lower than the second pixel density of the second display area DA2. Therefore, the luminance of the first display area DA1 may be lower than that of the second display area DA2.

The pixel density of the third display area DA3 may increase in a direction from the first display area DA1 to the second display area DA2. Therefore, the luminance of the third display area DA3 may gradually increase in a direction closer to the second display area DA2. Although a case where the luminance of the third display area DA3 linearly changes with the position is illustrated in FIG. 5, the luminance of the display area DA3 may also nonlinearly increase in the direction closer to the second display area DA2.

As described above, the display device 1000 including the sensor 300 overlapping a display area below the display area in exemplary embodiments of the invention may include the third display area DA3 in which a pixel density varies with the relative distance to the first display area DA1, thus minimizing (or mitigating) the perception of a sudden luminance difference between the first display area DA1 and the second display area DA2. Therefore, the image quality of the display device 1000 used to implement a full-screen display together with a camera function and a biometric sensor function may be improved.

Figure 6A:
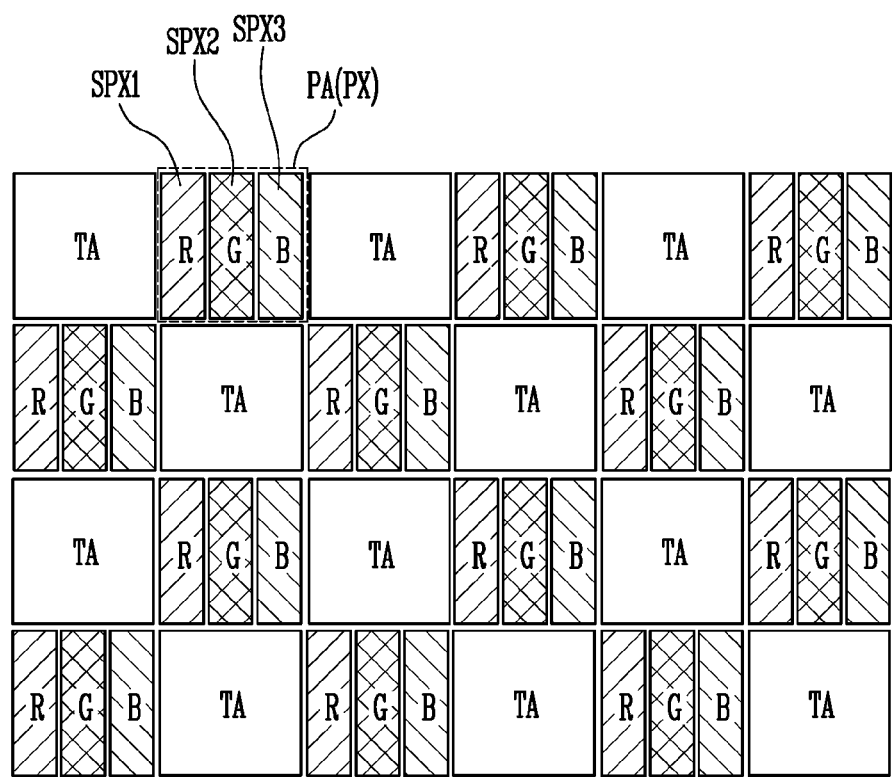
FIGS. 6A and 6B are views schematically illustrating exemplary embodiments of a first display area included in the display area of FIG. 3.
Figure 6B:
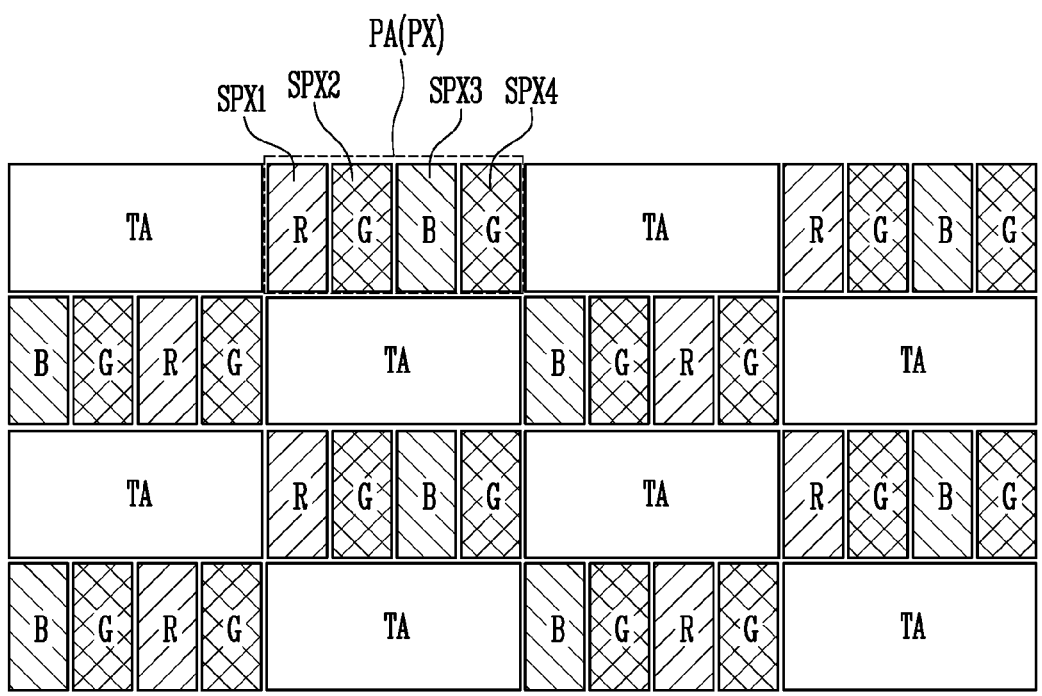

FIGS. 6A and 6B are views schematically illustrating an exemplary embodiment of a first display area included in the display area of FIG. 3.

Referring to FIGS. 3, 6A, and 6B, the first display area DA1 may include pixel areas PA including pixels PX and transmissive areas TA for transmitting external light to the sensor (e.g., 300 of FIG. 1).

Each pixel PX may include a plurality of sub-pixels. In an exemplary embodiment, as illustrated in FIG. 6A, a pixel PX (or one pixel area PA) may include first to third sub-pixels SPX1, SPX2, and SPX3 which emit light in different colors. The first to third sub-pixels SPX1, SPX2, and SPX3 may be arranged in a stripe pattern. In an exemplary embodiment, the first sub-pixel SPX1 may be a red sub-pixel, the second sub-pixel SPX2 may be a green sub-pixel, and the third sub-pixel SPX3 may be a blue sub-pixel, for example.

In an exemplary embodiment, as illustrated in FIG. 6B, a pixel PX (or one pixel area PA) may include first to four sub-pixels SPX1, SPX2, SPX3, and SPX4 which emit light in different colors. In an exemplary embodiment, the first sub-pixel SPX1 may be a red sub-pixel, the second sub-pixel SPX2 may be a green sub-pixel, the third sub-pixel SPX3 may be a blue sub-pixel, and the fourth sub-pixel SPX4 may be a green sub-pixel, for example.

However, this configuration is merely exemplary, and the arrangement of sub-pixels and emitted light colors are not limited thereto. Also, the area of at least one of the sub-pixels may be different from those of the remaining sub-pixels.

Figure 7A:
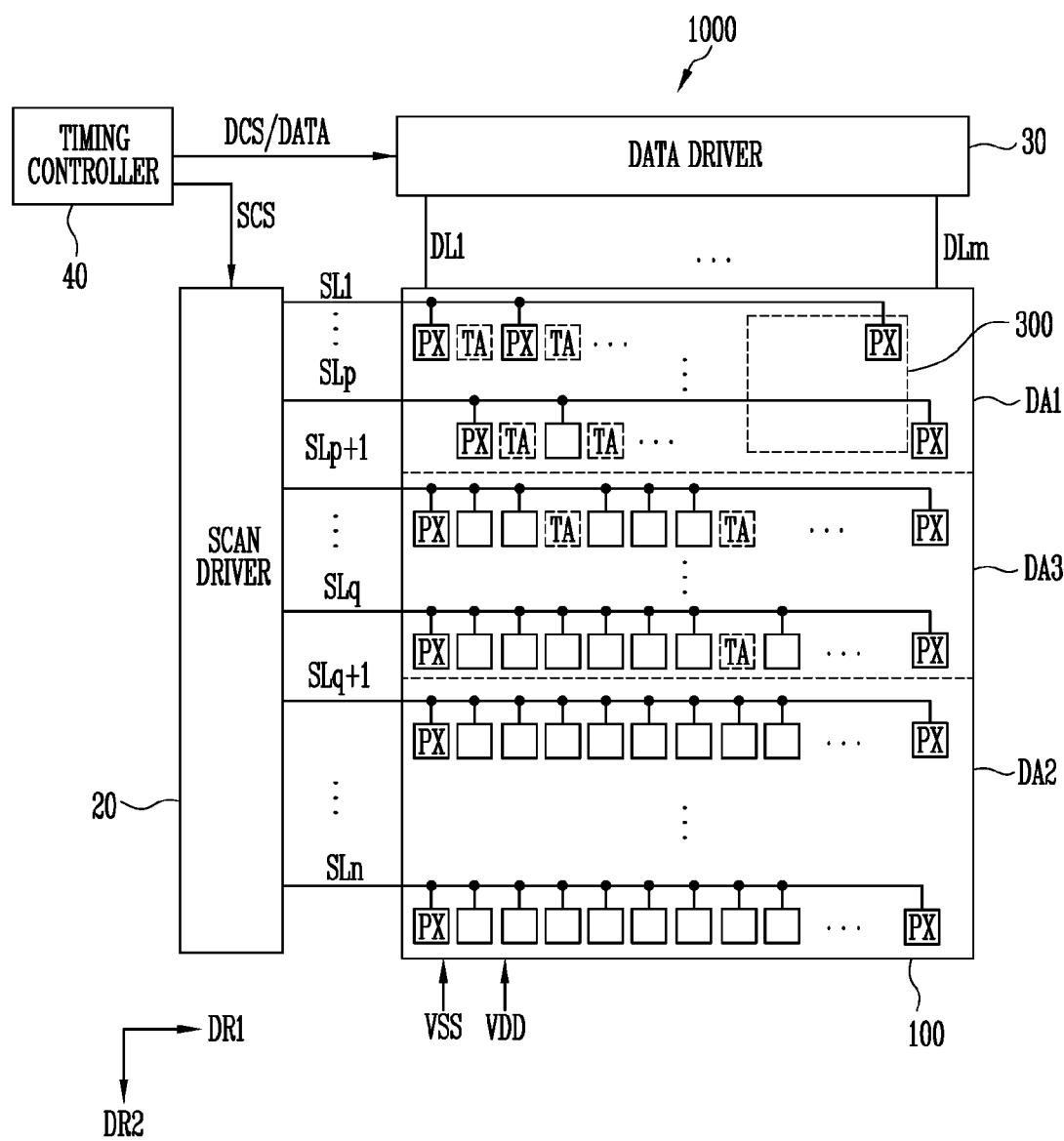
FIG. 7A is a block diagram illustrating an exemplary embodiment of the display device of FIG. 1.

FIG. 7A is a block diagram illustrating an exemplary embodiment of the display device of FIG. 1.

In FIG. 7A, the same reference numerals are assigned to the same or similar components described with reference to FIGS. 1 to 3, and repeated descriptions thereof will be omitted.

Referring to FIGS. 1, 3, and 7A, the display device 1000 may include a display panel 100, a sensor 300, and a panel driver. The panel driver may include a scan driver 20, a data driver 30, and a timing controller 40.

In an exemplary embodiment, the display device 1000 may further include an emission driver for supplying an emission control signal to pixels PX and a power supply for supplying predetermined supply voltages VDD and VSS to the pixels PX.

In an exemplary embodiment, the sensor 300 may be a photosensor, which may be disposed below a first display area DA1 of the display panel 100.

The display panel 100 may include first to third display areas DA1, DA2, and DA3. In an exemplary embodiment, the lengths of the first to third display areas DA1, DA2, and DA3 in a first direction DR1 may be equal to each other. However, the pixel densities of the first to third display areas DA1, DA2, and DA3 may be different from each other.

The first display area DA1 may include first to p-th (where p is a natural number greater than 1) pixel rows respectively coupled to first to p-th scan lines SL1 to SLp. In an exemplary embodiment, i (where i is a natural number greater than 1) pixels PX may be coupled to each of the first to p-th scan lines SL1 to SLp.

The third display area DA3 may include p+1-th to q-th (where q is a natural number greater than p+1) pixel rows respectively coupled to p+1-th to q-th scan lines SLp+1 to SLq. In an exemplary embodiment, different numbers of pixels PX may be coupled to the p+1-th to q-th scan lines SLp+1 to SLq, respectively. In an exemplary embodiment, j (where j is a natural number greater than i) pixels PX may be coupled to the p+1-th scan line SLp+1, and k (where k is a natural number greater than j) pixels PX may be coupled to the q-th scan line SLq, for example. That is, the number of pixels PX coupled to the q-th scan line SLq may be greater than the number of pixels PX coupled to the p+1-th scan line SLp+1. In this regard, the distance between transmissive areas TA corresponding to the q-th pixel row may be greater than the distance between transmissive areas TA corresponding to the p+1-th pixel row.

The second display area DA2 may actually occupy most of the display area. The second display area DA2 may include q+1-th to n-th (where n is a natural number greater than q+1) pixel rows respectively coupled to q+1-th to n-th scan lines SLq+1 to SLn.

Here, m (where m is a natural number greater than 1) pixels PX may be coupled to each of the p+1-th to n-th scan lines SLp+1 to SLn. In an exemplary embodiment, the number of pixels PX coupled to the n-th scan line SLn may be twice the number of pixels PX coupled to the first scan line SL1, for example. Also, the second display area DA2 does not include transmissive areas TA.

The scan driver 20 may supply scan signals to the first to n-th scan lines SL1 to SLn in response to a first control signal SCS. In an exemplary embodiment, the scan driver 20 may simultaneously supply scan signals (i.e., scan signals having a gate-on level) to all pixels PX, or may sequentially supply the scan signals to the first to n-th scan lines SL1 to SLn for each pixel row.

The data driver 30 may provide data signals (data voltages) to data lines DL1 to DLm based on a second control signal DCS and image data DATA which are provided from the timing controller 40. In an exemplary embodiment, the data driver 30 may convert digital image data DATA into analog data signals, and may provide the data signals to the pixels PX through the first to m-th data lines DL1 to DLm, for example. The image data DATA may include grayscale values corresponding to respective pixels PX.

The timing controller 40 may receive input image data, a vertical synchronization signal, a horizontal synchronization signal, a main clock signal, a data enable signal, etc., from an external graphic controller (not illustrated), and may generate the first and second control signals SCS and DCS and the image data DATA based on the received signals.

Figure 7B:
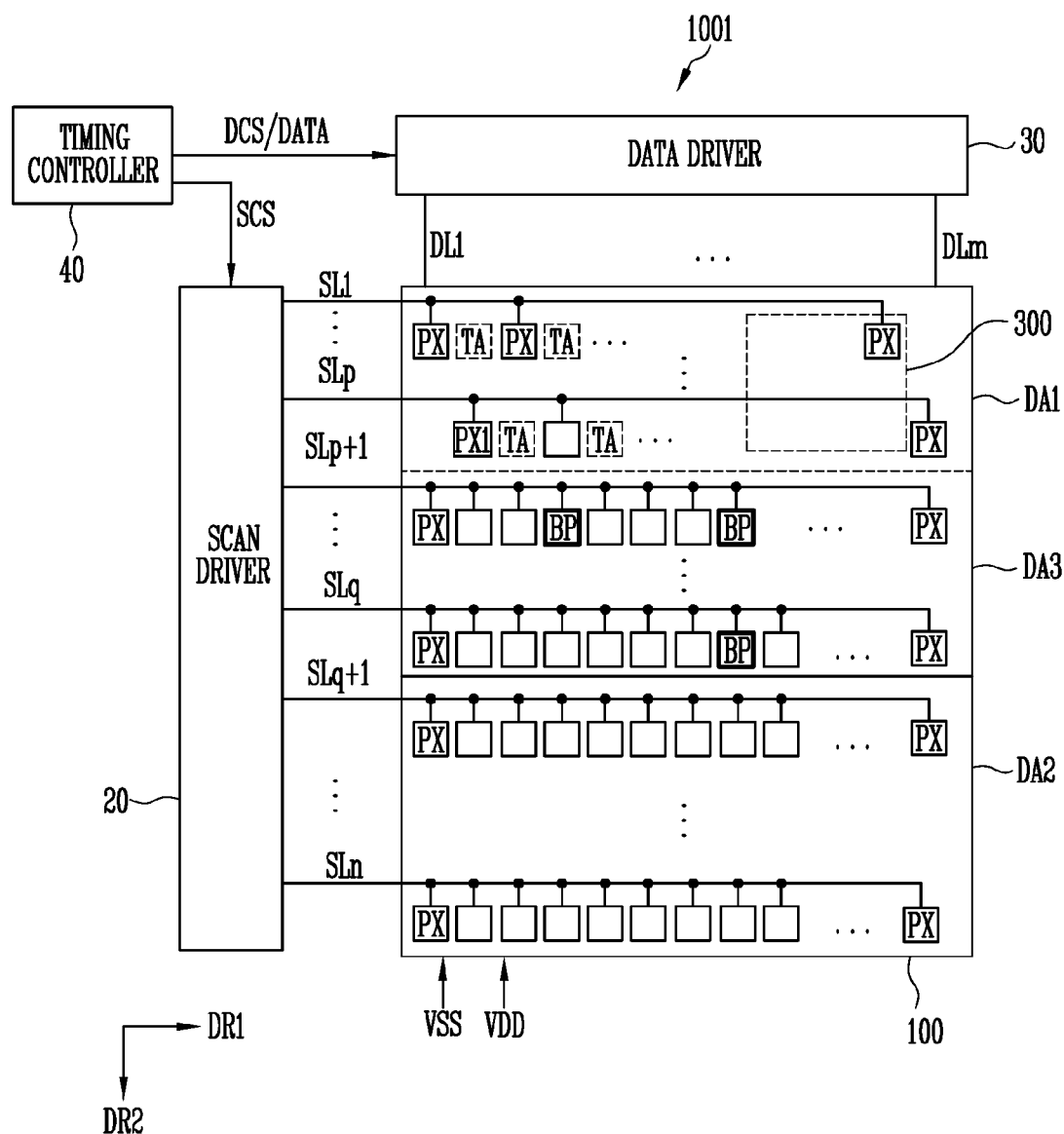
FIG. 7B is a block diagram illustrating an exemplary embodiment of the display device of FIG. 1.

FIG. 7B is a block diagram illustrating an exemplary embodiment of the display device of FIG. 1.

In FIG. 7B, the same reference numerals are assigned to the same or similar components described with reference to FIG. 7A, and repeated descriptions thereof will be omitted.

Referring to FIGS. 3 and 7B, a display device 1001 may include a display panel 100, a sensor 300, and a panel driver. The panel driver may include a scan driver 20, a data driver 30, and a timing controller 40.

In an exemplary embodiment, each of the third display area DA3 and the second display area DA2 does not include transmissive areas TA. The third display area DA3 may include valid pixels PX and black pixels BP. That is, the third display area DA3 may include a pixel array that is substantially the same as the second display area DA2.

The valid pixels PX may be normal pixels for displaying an image, and the black pixels BP may display black grayscale or may not emit light. In an exemplary embodiment, the black pixels BP included in the third display area DA3 may replace the transmissive areas TA in the third display area DA3 of FIGS. 3 and 7A, for example. Therefore, the number of black pixels BP may decrease in a direction farther away from the first display area DA1.

In an exemplary embodiment, the transmissive areas TA in the first to k-th sub-areas SA1 to SAk of FIG. 3 may be replaced with the black pixels BP, for example. The ratio of black pixels BL to valid pixels PX included in the first sub-area SA1 may be greater than the ratio of black pixels BP to valid pixel PX included in the second sub-area SA2.

In an exemplary embodiment, the black pixels BP may be arranged in a form in which they are disconnected from scan lines and/or data lines. Therefore, the black pixels BP do not perform functions of actual pixels. Accordingly, the luminance of the third display area DA3 may decrease in a direction closer to the first display area DA1.

In an exemplary embodiment, the black pixels BP may display only a black image. In an exemplary embodiment, the timing controller 40 may supply black grayscale image data corresponding to the black pixels BP to the data driver 30, and the data driver 30 may convert the black grayscale image data into black data signals (black data voltages) and supply the black data signals to the black pixels BP in each frame, for example. Accordingly, by means of the third display area DA3, the display device 1001 may have the effect of gradually decreasing luminance depending on the area.

In this way, the display device 1001 in the exemplary embodiment may differently adjust luminance values for respective areas in the third display area DA3 without greatly changing the arrangement of the pixels PX and signal wiring in the third display area DA3. Therefore, manufacturing costs may be reduced.

In an exemplary embodiment, the transmissive areas TA of FIG. 7A and the black pixel BP scheme of FIG. 7B may be simultaneously applied to the third display area DA3.

Figure 8:
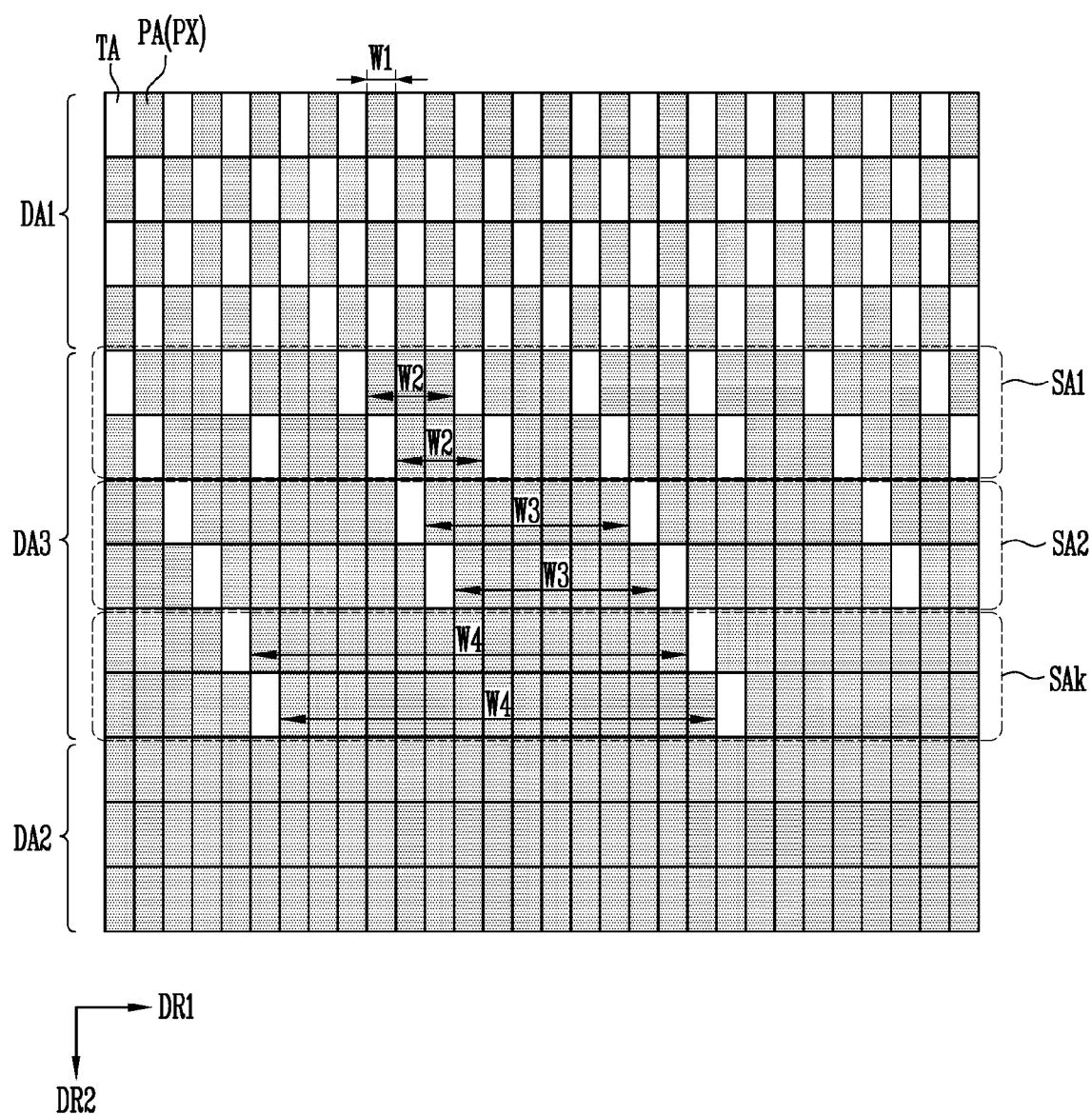
FIG. 8 is a view schematically illustrating an exemplary embodiment of a display area of the display device of FIG. 1.

FIG. 8 is a view schematically illustrating an exemplary embodiment of a display area of the display device of FIG. 1.

In FIG. 8, the same reference numerals are assigned to the same or similar components described with reference to FIG. 3, and repeated descriptions thereof will be omitted. Also, the display panel of FIG. 8 may have a configuration substantially identical or similar to the display panel of FIG. 3, except for the configuration of the third display area DA3.

Referring to FIGS. 3 and 8, the display panel 100 may include first to third display areas DA1, DA2, and DA3.

The pixel density of the third display area DA3 may increase in a direction farther away from the first display area DA1 to the second display area DA2. In an exemplary embodiment, the third display area DA3 may include first to k-th sub-areas SA1 to SAk.

In an exemplary embodiment, each of the first to k-th sub-areas SA1 to SAk may include two or more pixel rows. In each of pixel rows included in the first sub-area SA1, transmissive areas TA may be disposed at intervals of a second distance W2, and in each of pixel rows included in the second sub-area SA2, transmissive areas TA may be disposed at intervals of a third distance W3. The third distance W3 may be greater than the second distance W2. Accordingly, for the same image, the luminance of the second sub-area SA2 may be higher than that of the first sub-area SA1.

In adjacent pixel rows included in the third display area DA3, the transmissive areas TA may be provided not to be consecutively arranged in the second direction DR2.

Figure 9:
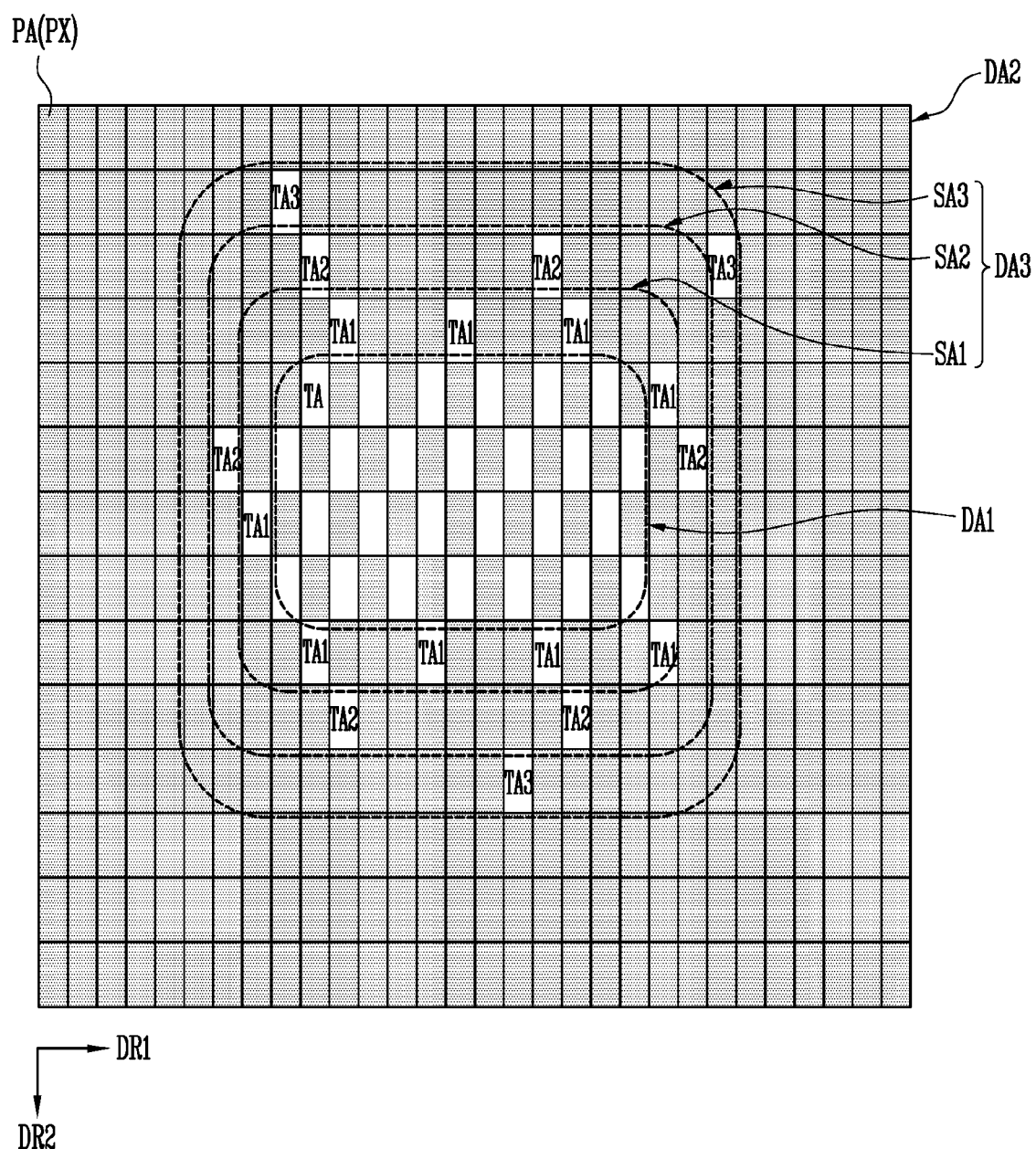
FIG. 9 is a view schematically illustrating an exemplary embodiment of a display area of the display device of FIG. 1.

FIG. 9 is a view schematically illustrating an exemplary embodiment of a display area of the display device of FIG. 1.

In FIG. 9, the same reference numerals are assigned to the same or similar components described with reference to FIG. 3, and repeated descriptions thereof will be omitted. Also, the display panel of FIG. 9 may have a configuration substantially identical or similar to the display panel of FIG. 3, except for planar shapes of first and third display areas DA1 and DA3.

Referring to FIGS. 3 and 9, the first display area DA1 may overlap an area in which a sensor (e.g., 300 of FIG. 1) is disposed, and may include only a part of some pixel rows. Also, the third display area DA3 may be disposed to surround the first display area DA1. The second display area DA2 may be disposed outside the third display area DA3.

The first display area DA1 may have the form of a polygon or a form in which at least one corner has a curved shape. As illustrated in FIG. 3, the first display area DA1 may include pixel areas PA and transmissive areas TA which are alternately arranged.

The third display area DA3 may include a first sub-area SA1 including pixels PX enclosing the first display area DA1, a second sub-area SA2 including pixels PX enclosing the first sub-area SA1, and a third sub-area SA3 including pixels PX enclosing the second sub-area SA2. In an exemplary embodiment, the first, second, and third sub-areas SA1, SA2, and SA3 may be provided within a boundary to which the first display area DA1 extends, for example.

Although the third display area DA3 is illustrated as including the three sub-areas SA1, SA2, and SA3 in FIG. 9, the shape and number of sub-areas are not limited thereto.

Each of the first to third sub-areas SA1, SA2, and SA3 may include pixel areas PA and transmissive areas TA. In an exemplary embodiment, the first sub-area SA1 may include first transmissive areas TA1, the second sub-area SA2 may include second transmissive areas TA2, and the third sub-area SA3 may include third transmissive areas TA3, for example.

The ratio of transmissive areas TA to pixel areas PA in the first display area DA1 may be set to a first ratio. A second ratio, which is the ratio of first transmissive areas TA1 to pixel areas PA in the first sub-area SA1, may be less than the first ratio. Also, a third ratio, which is the ratio of second transmissive areas TA2 to pixel areas PA in the second sub-area SA2, may be less than the second ratio. Similarly, a fourth ratio, which is the ratio of third transmissive areas TA3 to pixel areas PA in the third sub-area SA3, may be less than the third ratio.

Also, the first transmissive areas TA1 of the first sub-area SA1 may be provided along the boundary of the first display area DA1, the second transmissive areas TA2 of the second sub-area SA2 may be provided along the boundary of the first sub-area SA1, and the third transmissive areas TA3 of the third sub-area SA3 may be provided along the boundary of the second sub-area SA2. Here, the distance between the first transmissive areas TA1 may be less than the distance between the second transmissive areas TA2, and the distance between the second transmissive areas TA2 may be less than the distance between the third transmissive areas TA3.

Therefore, in a direction from the first sub-area SA1 to the third sub-area SA3, luminance values for the same image may gradually increase. Accordingly, perception of a sudden luminance difference between the first display area DA1 and the second display area DA2 may be minimized (or mitigated).

Figure 10:
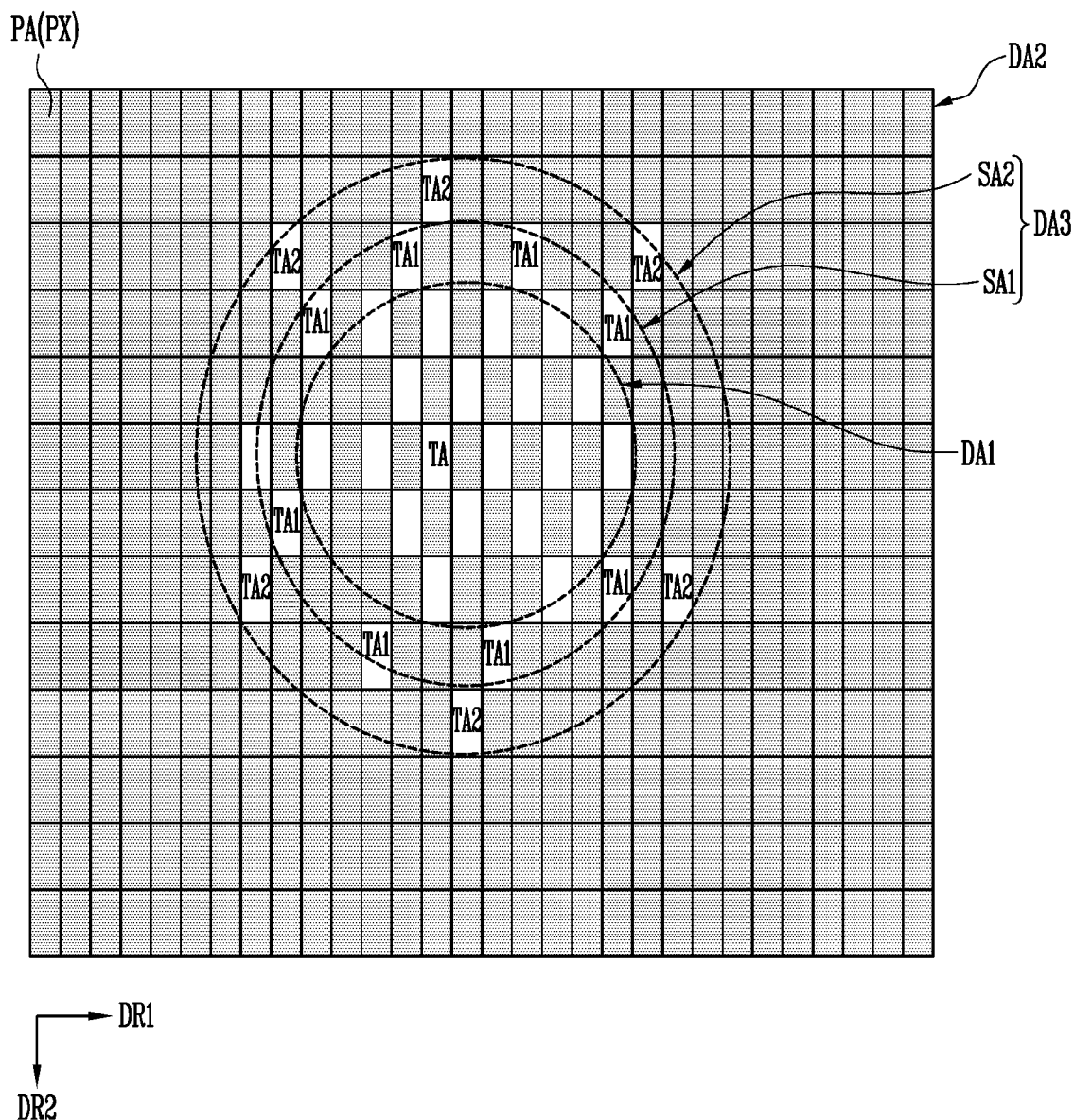
FIG. 10 is a view schematically illustrating an exemplary embodiment of a display area of the display device of FIG. 1.

FIG. 10 is a view schematically illustrating an exemplary embodiment of a display area of the display device of FIG. 1.

In FIG. 10, the same reference numerals are assigned to the same or similar components described with reference to FIG. 9, and repeated descriptions thereof will be omitted. Also, the display panel of FIG. 10 may have a configuration substantially identical or similar to the display panel of FIG. 9, except for the planar shapes of first and third display areas DA1 and DA3.

Referring to FIGS. 9 and 10, the first display area DA1 may overlap an area in which a sensor (e.g., 300 of FIG. 1) is arranged, and may include only a part of some pixel rows. Also, the third display area DA3 may be disposed to surround the first display area DA1. The second display area DA2 may be disposed outside the third display area DA3.

The first display area DA1 may have a circular shape or an elliptical shape.

The third display area DA3 may include a first sub-area SA1 including pixels PX enclosing the first display area DA1 and a second sub-area SA2 including pixels PX enclosing the first sub-area SA1. The third display area DA3 may further include additional sub-areas that extend outwardly from the second sub-area SA2.

Since the ratio of first transmissive areas TA1 to pixel areas PA in the first sub-area SA1 is greater than the ratio of second transmissive areas TA2 to pixel areas PA in the second sub-area SA2, luminance values for the same image may gradually increase in a direction from the first display area DA1 to the second display area DA2. Accordingly, perception of a sudden luminance difference between the first display area DA1 and the second display area DA2 may be minimized (or mitigated).

As described above, the display device in exemplary embodiments of the invention may include a photo-sensing type sensor (e.g., 300 of FIG. 1) below the first display area DA1 and also include the third display area DA3 in which a pixel density varies with a relative distance to the first display area DA1, thus minimizing (or mitigating) the perception of a sudden luminance difference between the first display area DA1 and the second display area DA2. Therefore, the image quality of the display device used to implement a full-screen display together with a camera function and a biometric sensor function may be improved.

However, advantages of the invention are not limited to the foregoing advantages, and may be expanded in various forms without departing from the spirit and scope of the invention.

Although the exemplary embodiments of the invention have been described, those skilled in the art will appreciate that the invention may be modified and changed in various forms without depart from the spirit and scope of the invention as claimed in the accompanying claims.

What is claimed is:

1. A display device, comprising:
a substrate;
a display panel which includes a first display area, a second display area, and a third display area between the first and second display areas, the first, second, and third display areas including a plurality of pixels; and
a sensor which is between the substrate and the first display area of the display panel and senses an external object through the first display area,
wherein the first display area comprises pixel areas in which pixels of the plurality of pixels are arranged and transmissive areas in which the plurality of pixels is not arranged,
wherein the second display area and the third display area do not include the transmissive areas,
wherein the third display area comprises valid pixels of the plurality of pixels which display an image and black pixels of the plurality of pixels which display a black grayscale or do not emit light,
wherein a number of the black pixels decreases in a direction farther away from the first display area,
wherein a pixel density of the third display area in pixel rows extending in a first direction gradually increases with respect to a total number of light emitting elements in a corresponding pixel row of a plurality of pixel rows in the third display area in a second direction orthogonal to the first direction closer to the second display area,
wherein the third display area further includes pixel rows, each including pixel areas in which pixels of the plurality of pixels are arranged,
wherein the black pixels are disposed at intervals of a preset first distance in each of the pixel rows, and
wherein a distance between adjacent black pixels extending in the first direction in a pixel row of the third display area gradually increases with respect to subsequent pixel rows in the second direction closer to the second display area.

2. The display device according to claim 1, wherein:
in each of the transmissive areas, a light-emitting element and a pixel circuit are not disposed, and each of the black pixels comprises the light-emitting element and the pixel circuit.

3. The display device according to claim 1, wherein:
the third display area further comprises:
a first sub-area which surrounds at least a portion of the first display area; and
a second sub-area disposed outside the first sub-area, and
a ratio of the black pixels to the valid pixels included in the first sub-area is greater than a ratio of the black pixels to the valid pixels included in the second sub-area.

4. The display device according to claim 1, further comprising:
a data driver which supplies data signals to the plurality of pixels,
wherein the data driver supplies only a black data signal corresponding to the black grayscale to the black pixels.

* * * * *